US011676925B2

(12) United States Patent
Hong et al.

(10) Patent No.: US 11,676,925 B2
(45) Date of Patent: *Jun. 13, 2023

(54) SEMICONDUCTOR PACKAGES HAVING IMPROVED RELIABILITY IN BONDS BETWEEN CONNECTION CONDUCTORS AND PADS AND METHODS OF MANUFACTURING THE SAME

(71) Applicant: Samsung Electronics Co., Ltd., Suwon-si (KR)

(72) Inventors: Jiseok Hong, Yongin-si (KR); Hyuekjae Lee, Hwaseong-si (KR); Jongpa Hong, Suwon-si (KR); Jihwan Hwang, Hwaseong-si (KR); Taehun Kim, Asan-si (KR)

(73) Assignee: Samsung Electronics Co., Ltd., Hickory, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/500,079

(22) Filed: Oct. 13, 2021

(65) Prior Publication Data

US 2022/0068863 A1 Mar. 3, 2022

Related U.S. Application Data

(63) Continuation of application No. 17/007,223, filed on Aug. 31, 2020, now Pat. No. 11,158,594.

(30) Foreign Application Priority Data

Nov. 12, 2019 (KR) .................. 10-2019-0144198

(51) Int. Cl.
*H01L 23/00* (2006.01)
*H01L 25/065* (2023.01)
*H01L 23/48* (2006.01)

(52) U.S. Cl.
CPC ............ *H01L 24/13* (2013.01); *H01L 23/481* (2013.01); *H01L 24/05* (2013.01); *H01L 24/81* (2013.01);
(Continued)

(58) Field of Classification Search
CPC ..... H01L 24/13; H01L 25/0657; H01L 24/05; H01L 23/481; H01L 24/81;
(Continued)

(56) References Cited

U.S. PATENT DOCUMENTS 6,210,811 B1 4/2001 Honda et al.
7,070,670 B2 7/2006 Tomiyama et al.
(Continued)

FOREIGN PATENT DOCUMENTS

JP 2004319823 A 11/2004
JP 5549559 B2 7/2014

*Primary Examiner* — Mamadou L Diallo
(74) *Attorney, Agent, or Firm* — Myers Bigel, P.A.

(57) ABSTRACT

A semiconductor package includes a first semiconductor chip having a through-electrode and an upper connection pad on an upper surface of the first semiconductor chip that is connected to the through-electrode; a second semiconductor chip stacked on the first semiconductor chip, and having a lower connection pad on a lower surface of the second semiconductor chip; a non-conductive film between the first semiconductor chip and the second semiconductor chip, with the non-conductive film including voids having an average diameter of 1 μm to 100 μm, the voids having a volume fraction of 0.1 to 5 vol %; and a connection conductor that penetrates the non-conductive film and connects the upper connection pad and the lower connection pad.

20 Claims, 11 Drawing Sheets

(52) U.S. Cl.
CPC .. *H01L 25/0657* (2013.01); *H01L 2224/1357* (2013.01); *H01L 2224/13541* (2013.01); *H01L 2924/1434* (2013.01)

(58) Field of Classification Search
CPC ..... H01L 2924/1434; H01L 2224/1357; H01L 2224/13541
See application file for complete search history.

(56) References Cited

U.S. PATENT DOCUMENTS

| | | |
|---|---|---|
| 8,138,580 B2 | 3/2012 | Konishi et al. |
| 9,382,455 B2 | 7/2016 | Tsuchiyama et al. |
| 9,673,120 B2 | 6/2017 | Kim et al. |
| 2007/0170575 A1* | 7/2007 | Lee .................. H01L 23/66 257/E25.013 |
| 2011/0151563 A1 | 6/2011 | Paukshto et al. |
| 2015/0102485 A1* | 4/2015 | Kang ................ H01L 24/32 524/439 |
| 2017/0207199 A1* | 7/2017 | Kira .................. H01L 25/074 |
| 2017/0338206 A1* | 11/2017 | Seo .................. H01L 25/0657 |
| 2019/0067232 A1* | 2/2019 | Wirz ................. H01L 24/14 |
| 2019/0348303 A1* | 11/2019 | Kulkarni ............. H01L 24/27 |
| 2020/0098719 A1* | 3/2020 | Park ................. H01L 23/3128 |
| 2021/0111160 A1* | 4/2021 | Kim ................... H01L 25/18 |

* cited by examiner

SEMICONDUCTOR PACKAGES HAVING IMPROVED RELIABILITY IN BONDS BETWEEN CONNECTION CONDUCTORS AND PADS AND METHODS OF MANUFACTURING THE SAME

CROSS-REFERENCE TO RELATED APPLICATION(S)

The present application is a continuation of and claims priority to U.S. application Ser. No. 17/007,223, filed on Aug. 31, 2020, which in turn, claims benefit of priority to Korean Patent Application No. 10-2019-0144198, filed on Nov. 12, 2019, in the Korean Intellectual Property Office, the disclosures of which are incorporated by reference herein in their entirety.

BACKGROUND

The present inventive concepts relate to semiconductor devices, to semiconductor packages having semiconductor devices, and to methods of manufacturing semiconductor devices and semiconductor packages.

Electronic devices are becoming smaller and lighter due to advances and developments within electronic industries, and users are increasingly requiring semiconductor packages used in the electronic devices to have increased performance and increased capacity while being smaller and lighter. In order to realize increased performance and capacity while being miniaturized and lightweight, research and development into semiconductor chips including through-electrodes and semiconductor packages in which the semiconductor chips are stacked is being performed.

SUMMARY

Aspects of the present disclosure provide semiconductor packages having improved reliability in bonding a connection conductor (e.g., a solder) and a pad (e.g., an upper connection pad), and/or improved reliability in a bond between a connection conductor and a pad.

Example embodiments provide methods of manufacturing semiconductor packages having improving reliability in bonding a connection conductor and a pad and/or in a bond between connection conductor and a pad.

According to some aspects of the present disclosure, a semiconductor package may include: a first semiconductor chip having a through-electrode and an upper connection pad on an upper surface of the first semiconductor chip that is connected to the through-electrode; a second semiconductor chip stacked on the first semiconductor chip, and having a lower connection pad on a lower surface of the second semiconductor chip; a non-conductive film between the first and second semiconductor chips, wherein the non-conductive film includes voids having an average diameter of 1 μm to 100 μm, the voids having a volume fraction of 0.1 to 0.5 vol % in the non-conductive film; and a connection conductor that penetrates the non-conductive film and connects the upper connection pad and the lower connection pad.

According to some aspects of the present disclosure, a semiconductor package may include: a plurality of stacked first semiconductor chips, each first semiconductor chip having a through-electrode, an upper connection pad on an upper surface of the first semiconductor chip that is connected to the through-electrode and, and a lower connection pad on a lower surface of the first semiconductor chip that is connected to the through-electrode; a second semiconductor chip stacked on an uppermost first semiconductor chip of the plurality of first semiconductor chips, and having a lower connection pad on a lower surface of the second semiconductor chip; a plurality of non-conductive films between adjacent pairs of the plurality of first semiconductor chips and between the uppermost first semiconductor chip and the second semiconductor chip, wherein each of the plurality of non-conductive films has voids therein and a concave side surface thereof; and a connection conductor within each of the plurality of non-conductive films that connects the upper connection pad and the lower connection pad of the adjacent semiconductor chips. A deviation of the volume fraction of the voids of the plurality of non-conductive films is 5% or less.

According to some aspects of the present disclosure, a semiconductor package may include: a base substrate having a wiring circuit; a first semiconductor chip stacked on the base substrate, and having a through-electrode, an upper connection pad on an upper surface of the first semiconductor chip that is connected to the through-electrode, and a lower connection pad on a lower surface of the first semiconductor chip that is connected to the through-electrode; a second semiconductor chip stacked on the first semiconductor chip, and having a lower connection pad on a lower surface thereof; a first non-conductive film between the base substrate and the first semiconductor chip; a second non-conductive film between the first semiconductor chip and the second semiconductor chip; a first connection conductor that penetrates the first non-conductive film to connect the wiring circuit of the base substrate with the lower connection pad of the first semiconductor chip; and a second connection conductor that penetrates the second non-conductive film to connect the upper connection pad of the first semiconductor chip with the lower connection pad of the second semiconductor chip. The first and second non-conductive films each have voids having an average diameter of 1 μm to 100 μm, a volume fraction of the voids being 0.1 to 5 vol %.

According to an embodiment of the present disclosure, a method of manufacturing a semiconductor may include operations of: preparing a first semiconductor chip having a through-electrode and an upper connection pad connected to the through-electrode on an upper surface of the first semiconductor chip; preparing a second semiconductor chip having a lower connection pad on a lower surface thereof and a connection conductor on the lower connection pad; applying an uncured non-conductive film to the lower surface of the second semiconductor chip to cover the connection conductor, wherein voids included in the uncured non-conductive film have a first average diameter and a first volume fraction; stacking the second semiconductor chip to which the uncured non-conductive film is applied on the first semiconductor chip; heating and pressurizing the stacked first and second semiconductor chips using a pressurized fluid to cure the non-conductive film, wherein voids included in the cured non-conductive film have a second average diameter smaller than the first average diameter and a second volume fraction less than the first volume fraction.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concepts will be described in detail with reference to the accompanying drawings.

Figure 1:
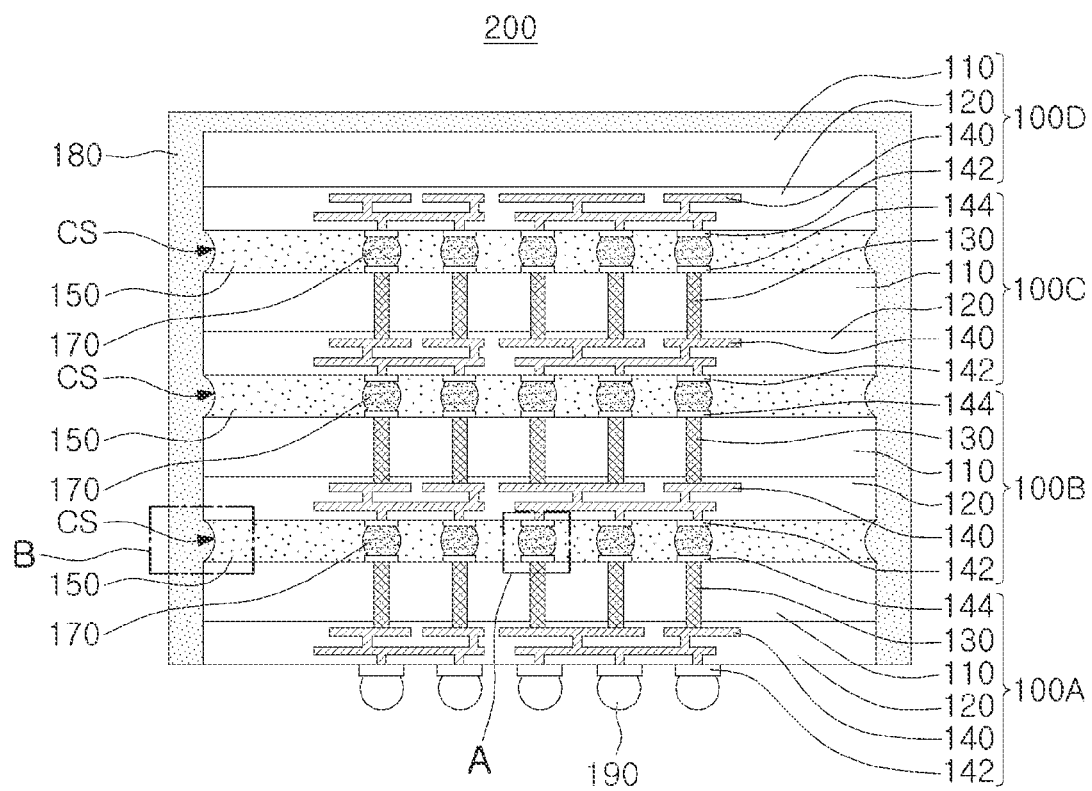
FIG. 1 is a cross-sectional view illustrating a semiconductor package according to some example embodiments of the present disclosure.

FIG. 1 is a cross-sectional view illustrating a semiconductor package according to some example embodiments.

Referring to FIG. 1, a semiconductor package 200 may include a first semiconductor chip 100A, a second semiconductor chip 100B, a third semiconductor chip 100C, and a fourth semiconductor chip 100D, which may be stacked sequentially in a vertical direction. Each of the stacked first to fourth semiconductor chips 100A, 100B, 100C, and 100D may be electrically connected to adjacent semiconductor chips through a connection conductor 170 such as a solder bump. For example, the second semiconductor chip 100B may be electrically connected to the first semiconductor chip 100A via a first connection conductor 170, and may also be electrically connected to the third semiconductor chip 100C via a second connection conductor 170.

The first to fourth semiconductor chips 100A, 100B, 100C, and 100D may each include a semiconductor substrate 110, a semiconductor device layer 120, a lower connection pad 142, and connection conductors 170. In some embodiments, the first semiconductor chip 100A, which may be at a lowermost portion of the semiconductor package 200, may have an external connection conductor 190 in lieu of a connection conductor 170. As in the present example embodiment, in some embodiments the first to third semiconductor chips 100A, 100B, and 100C may further include a through-electrode 130 and an upper connection pad 144, and the fourth semiconductor chip 100D, which may be at an uppermost portion of the semiconductor package 200, may not include the through-electrode 130 and the upper connection pad 144.

Each of the semiconductor substrates 110 of the first to fourth semiconductor chips 100A, 100B, 100C, and 100D may have upper and lower surfaces, opposite to each other. The semiconductor device layer 120 of each semiconductor chip 100 may be on a lower surface of the respective semiconductor substrate 110. Each semiconductor device layer 120 may be provided with semiconductor elements such as transistors (not shown) and a wiring structure 140 connected to the semiconductor elements. In some example embodiments, the semiconductor substrates 110 may include silicon. In some example embodiments, the semiconductor substrates 110 may include a semiconductor element such as germanium, or a compound semiconductor such as silicon carbide (SiC), gallium arsenide (GaAs), indium arsenide (InAs), and indium phosphide (InP). In some example embodiments, the semiconductor substrates 110 may have a silicon on insulator (SOI) structure. For example, the semiconductor substrates 110 may include a buried oxide (BOX) layer. The semiconductor substrates 110 may include a conductive region such as, for example, a well doped with impurities or a structure doped with impurities. In addition, the semiconductor substrates 110 may have various element isolation structures, such as a shallow trench isolation (STI) structure. In some example embodiments, a wiring structure 140 may include a metal wiring layer and via plugs. For example, the wiring structure 140 may be a multilayer structure in which two or more metal wiring layers or two or more via plugs are alternately stacked.

The through-electrodes 130 of each of the first to third semiconductor chips 100A, 100B, and 100C may penetrate the respective semiconductor substrate 110, and may be connected to the respective semiconductor device layer 120 (e.g., may be connected to the wiring structure 140 of the respective semiconductor device layer 120). The through-electrodes 130 of each of the first to third semiconductor chips 100A, 100B, and 100C may extend from the upper surface of the respective semiconductor substrate 110 to the lower surface thereof and may extend into the semiconductor device layer 120. At least a portion of each of the through-electrodes 130 may be columnar. The through-electrodes 130 may be also referred to as through substrate vias (TSVs).

Lower connection pads 142 may be formed on lower surfaces of the first to fourth semiconductor chips 100A, 100B, 100C, and 100D, and may be formed on the semiconductor device layer 120 of each semiconductor chip. The lower connection pads of each of the first to fourth semiconductor chips 100A, 100B, 100C, and 100D may be electrically connected to the respective semiconductor device layer 120 and the through-electrode 130 through the wiring structure 140. The lower connection pad 142 may include at least one of aluminum (Al), copper (Cu), nickel (Ni), tungsten (W), platinum (Pt), and gold (Au), as examples.

In some example embodiments, a lower passivation layer (not shown) may be formed on the semiconductor device layer 120 to protect the wiring structure 140 and the like in the semiconductor device layer 120 from external impacts or moisture. At least a portion of the lower connection pad 142 may be exposed from the lower passivation layer.

Upper connection pads 144, which are electrically connected to the through-electrode 130, may be arranged on upper surfaces of the first to third semiconductor chips 100A, 100B, and 100C, and may be on the upper surface of each semiconductor substrate 110 thereof. The upper connection pad 144 may include the same material as the lower connection pad 142. For example, the upper connection pad 144 may include at least one of aluminum (Al), copper (Cu), nickel (Ni), tungsten (W), platinum (Pt), and gold (Au). In some example embodiments, an upper passivation layer (not shown) may be formed to surround at least a portion of a side surface of the through-electrode 130 on the upper surface of the semiconductor substrate 110.

The connection conductors 170 may be arranged on the lower connection pads 142 of the second to fourth semiconductor chips 100B, 100C, and 100D, respectively. The connection conductors 170 and/or the external connection conductor 190 may have various shapes such as pillars or balls, as examples.

The first to fourth semiconductor chips 100A, 100B, 100C, and 100D may receive at least one of control signals, power signals, or ground signals for an operation of the first to fourth semiconductor chips 100A, 100B, 100C, and 100D through the connection conductors 170 and the external connection conductor 190 from one or more external devices. Data signals to be stored in the first to fourth semiconductor chips 100A, 100B, 100C, and 100D may be received from the one or more external devices, and/or data stored in the first to fourth semiconductor chips 100A, 100B, 100C, and 100D may be transmitted to the one or more external devices.

In some example embodiments, the external connection conductor 190 of the first semiconductor chip 100A located at a lowermost level may be used to electrically connect the semiconductor package 200 to an external circuit board (e.g., a motherboard or an interposer). The first to fourth semiconductor chips 100A, 100B, 100C and 100D may be connected to each other, through the connection conductors 170. More specifically, the connection conductors 170 arranged on the lower connection pads 142 of second to fourth semiconductor chips 100B, 100C, and 100D may be electrically/mechanically connected to the upper connection pads 144 of an adjacent one of the first to third semiconductor chips 100A, 100B, and 100C.

The second to fourth semiconductor chips 100B, 100C, and 100D may be bonded to the adjacent first to third semiconductor chips 100A, 100B, and 100C, by non-conductive films (NCFs) 150. The connection conductors 170 may penetrate the non-conductive films 150 to connect the upper connection pads 144 and the lower connection pads 142.

Figure 2:
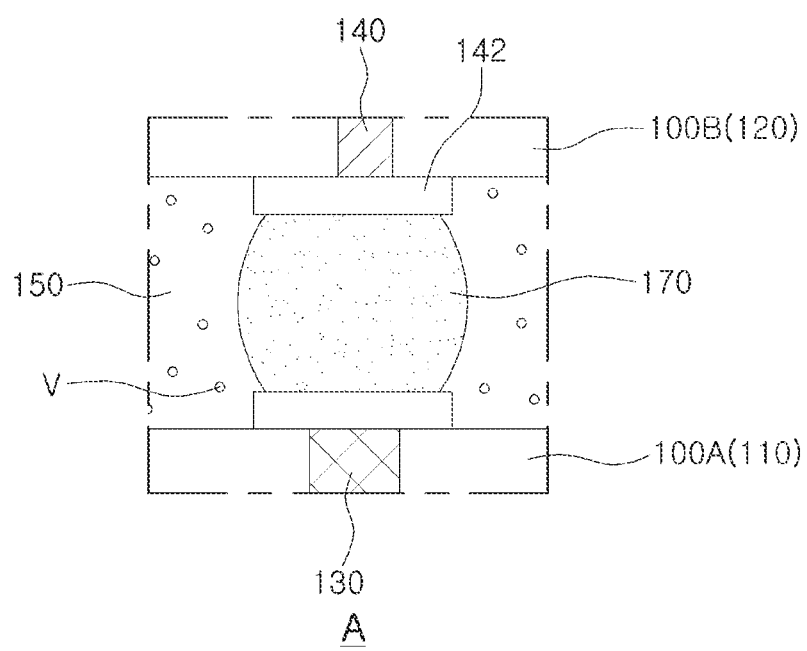
FIGS. 2 and 3 are cross-sectional views illustrating enlarged portions "A" and "B" of FIG. 1.

As shown in FIG. 2, which is a cross-sectional view illustrating the enlarged portion "A" of FIG. 1, in some example embodiments, voids V may be present in the non-conductive films 150 that bond adjacent ones of the first to fourth semiconductor chips 100A, 100B, 100C, and 100D. By intentionally distributing voids in uncured non-conductive films, volume shrinkage (particularly, thickness reduction) of the non-conductive films 150 may be generated sufficiently in a pressure bonding process such as hydrostatic bonding. As a result, a more stable connection between the upper connection pad 144 and the connection conductor 170 can be achieved in the bonding process. The voids V in the non-conductive films 150 shown in FIG. 2 may be understood as voids remaining after the pressure bonding process (removal and reduction).

The voids V in the non-conductive films 150 may be filled with gas that does not react with surrounding components. Since the voids V may be in contact with the connection conductor 170 such as solder bumps, the voids V may be filled with gas that does not react with the connection conductor 170. For example, the voids V may be filled with nitrogen.

The voids V of the non-conductive films 150 may have a predetermined size and a volume fraction that do not significantly affect reliability. For example, the voids V of each of the non-conductive films 150 may have an average diameter of 1 μm to 100 μm. In some example embodiments, the average diameter of the voids may be 50 μm or less. The volume fraction of the voids V may be in a range of 0.1 to 5 vol %, as examples. In some example embodiments, the volume fraction of the voids V may be in a range of 2 vol % or less. Here, the volume fraction may be a value representing a percentage of the volume occupied by an entire void in a total volume of the corresponding non-conductive film.

Figure 3:
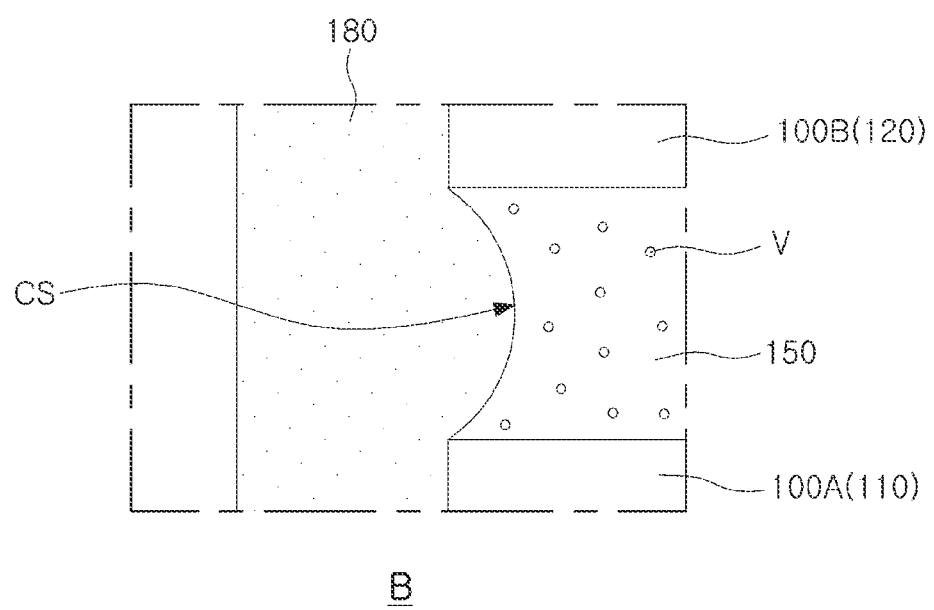

FIG. 3 is a cross-sectional view illustrating the enlarged portion "B" of FIG. 1. The non-conductive films 150 may have a concave side surface CS as shown in FIGS. 1 and 3. In the cross-sectional view illustrated in FIGS. 1 and 3, the concave side surface CS may have a shape recessed inward of the side surfaces of the adjacent first to fourth semiconductor chips 100A, 100B, 100C, and 100D. For example, such side surface CS may be a shape obtained by hydrostatic bonding (see FIG. 10 and the associated description thereof). Since pressure applied during hydrostatic bonding may be applied not only in a lamination direction but also in a width direction of the non-conductive film 150, the side surfaces of the non-conductive films 150 may be prevented from flowing outwardly, and the thickness reduction of the non-conductive film may also be suppressed. As a result, some of the connection conductors 170 may not be connected to the upper connection pad 144 or solder wetting may not be performed sufficiently to cause a connection failure.

However, in some example embodiments according to the present disclosure, by intentionally providing voids to the uncured non-conductive films through removal/reduction of the voids in the hydrostatic bonding environment, the thicknesses of the final non-conductive films 150 may sufficiently be reduced while the final non-conductive films 150 have concave side surfaces (CS), resulting in ensuring a reliable connection of the connection conductor 170 and the upper connection pad 144.

The pressure bonding process may be applied simultaneously to each of the non-conductive films 150 after stacking the first to fourth semiconductor chips 100A, 100B, 100C, and 100D. In this case, the voids V of the non-conductive films 150 may have similar distributions. For example, the volume fraction of the voids V of the non-conductive films 150 may have a deviation of 5% or less. Similarly thereto, the voids V of the non-conductive films 150 may have similar sizes to each other. Similarly thereto, the voids V of the non-conductive films 150 may have similar sizes to each other. Here, the deviation may be a value based on a difference between a maximum volume fraction (or an average diameter) and a minimum volume fraction (an average diameter) among the non-conductive films, and it may be represented as [(maximum volume fraction (or average diameter)-minimum volume fraction (average diameter))/maximum volume fraction (or average diameter)×100].

Meanwhile, as best seen in FIG. 3, a molding member 180 may be inserted and bonded to the concave side surface CS of the non-conductive films 150. As such, the concave side surface CS may increase a bonding area of the non-conductive films 150 and may improve bonding strength of the molding member 180. The molding member 180 may surround side surfaces of the first to fourth semiconductor chips 100A, 100B, 100C, and 100D and side surfaces of the non-conductive films 150.

In some example embodiments, the molding member 180 may cover an upper surface of the fourth semiconductor chip 100D. In some example embodiments, the molding member 180 may expose an upper surface of the fourth semiconductor chip 100D (see FIG. 4 and the associated description thereof). The molding member 180 may include an epoxy mold compound (EMC), as an example.

The first to fourth semiconductor chips 100A, 100B, 100C, and 100D may be memory chips or logic chips. In some example embodiments, all of the first to fourth semiconductor chips 100A, 100B, 100C, and 100D may be memory chips of the same kind. In some example embodiments, some of the first to fourth semiconductor chips 100A, 100B, 100C, and 100D may memory chips, and others may be logic chips.

The first to fourth semiconductor chips 100A, 100B, 100C, and 100D may be volatile memory chips and/or non-volatile memory chips. Examples of volatile memory chips include Dynamic Random Access Memory (DRAM) or Static Random Access Memory (SRAM), and examples of non-volatile memory chips include Phase-change Random Access Memory (PRAM), Magnetoresistive Random Access Memory (MRAM), Ferroelectric Random Access Memory (FeRAM), or Resistive Random Access Memory (RRAM). In some example embodiments, the first to fourth semiconductor chips 100A, 100B, 100C, and 100D may be high bandwidth memory (HBM) DRAMs.

The first to fourth semiconductor chips 100A, 100B, 100C, and 100D may be logic chips, examples of which include microprocessors, analog devices, or digital signal processors.

Although a semiconductor package 200 in which four semiconductor chips are stacked (e.g., the first to fourth semiconductor chips 100A, 100B, 100C, and 100D) is illustrated in FIG. 1, the number of semiconductor chips stacked in the semiconductor package 200 is not limited thereto. For example, two, three, or more than four semiconductor chips (e.g., eight) may be stacked in the semiconductor package 200.

The first to fourth semiconductor chips 100A, 100B, 100C, and 100D may be indistinguishable from one other (e.g., may provide the same functionality), and may have the same cross-sectional area, volume, and/or dimensions, as shown in FIG. 1. In some example embodiments, the first to fourth semiconductor chips 100A, 100B, 100C, and 100D may have different cross-sectional areas, volume, and/or dimensions from each other. Side surfaces of the first to fourth semiconductor chips 100A, 100B, 100C, and 100D may not be arranged to be positioned on substantially the same plane, and may have an at least partially stepped arrangement. In this case, the non-conductive films 150 may include voids V remaining therein. In addition, the side surfaces CS of the non-conductive films 150 may have a curved shape recessed inwardly of the side surfaces of adjacent semiconductor chips.

As described above, in order to reduce the size and weight of the semiconductor package, a structure in which the first to fourth semiconductor chips 100A, 100B, 100C, and 100D are stacked atop one another and coupled via through-electrodes 130 may be employed. In order to bond the first to fourth semiconductor chips 100A, 100B, 100C, and 100D with electrical reliability and structural reliability while being uniform with each other in the stacking process of the semiconductor chip, the connection conductors 170 together with the non-conductive films 150, which are interlayer bonding materials, may be used.

By using the voids of the non-conductive films 150, a more stable connection of the connection conductor 170 and the upper connection pad 144 may be provided, and an overflow of the non-conductive film 150 may not occur in a process of the thicknesses of the non-conductive films 150. Accordingly, the reliability of the semiconductor package can be improved. In addition, the bonding strength of the molding member 180 and the non-conductive films 150 may be increased.

The non-conductive films 150 may use a resin in order to adhere to the stacked first to fourth semiconductor chips 100A, 100B, 100C, and 100D. The non-conductive films 150 may include an adhesive resin such as a thermosetting resin. The adhesive resin may include, for example, at least one of a bisphenol-type epoxy resin, a noblock-type epoxy resin, a phenol resin, a urea resin, a melamine resin, an unsaturated polyester resin, and a resorcinol resin.

The non-conductive films 150 employed in some example embodiments may have a relatively low viscosity to facilitate the removal and reduction of the voids. For example, the non-conductive films 150 may have a viscosity in a range of about 1200 Pa·s or less, preferably 800 Pa·s. Here, the viscosity refers to a viscosity when the viscosity of the non-conductive films 150 becomes a lowest point, and is a value measured at a temperature condition of about 100° C. The measurement temperature may have an error range of about ±5° C. based on 100° C.

In some example embodiments, the non-conductive films 150 may include a flux and/or a ceramic filler. The flux may be used for soldering for electrical bonding between semiconductor chips in a semiconductor package manufacturing process. The flux improves the spreadability and/or wettability of the solder, and the flux may be previously applied to an area where the solder is to be applied or may be included in the non-conductive films 150. Examples of the flux may include a rosin, a modified rosin, and a synthetic resin. The ceramic filler may adjust the viscosity of the non-conductive films 150 according to a particle size and content thereof.

Figure 4:
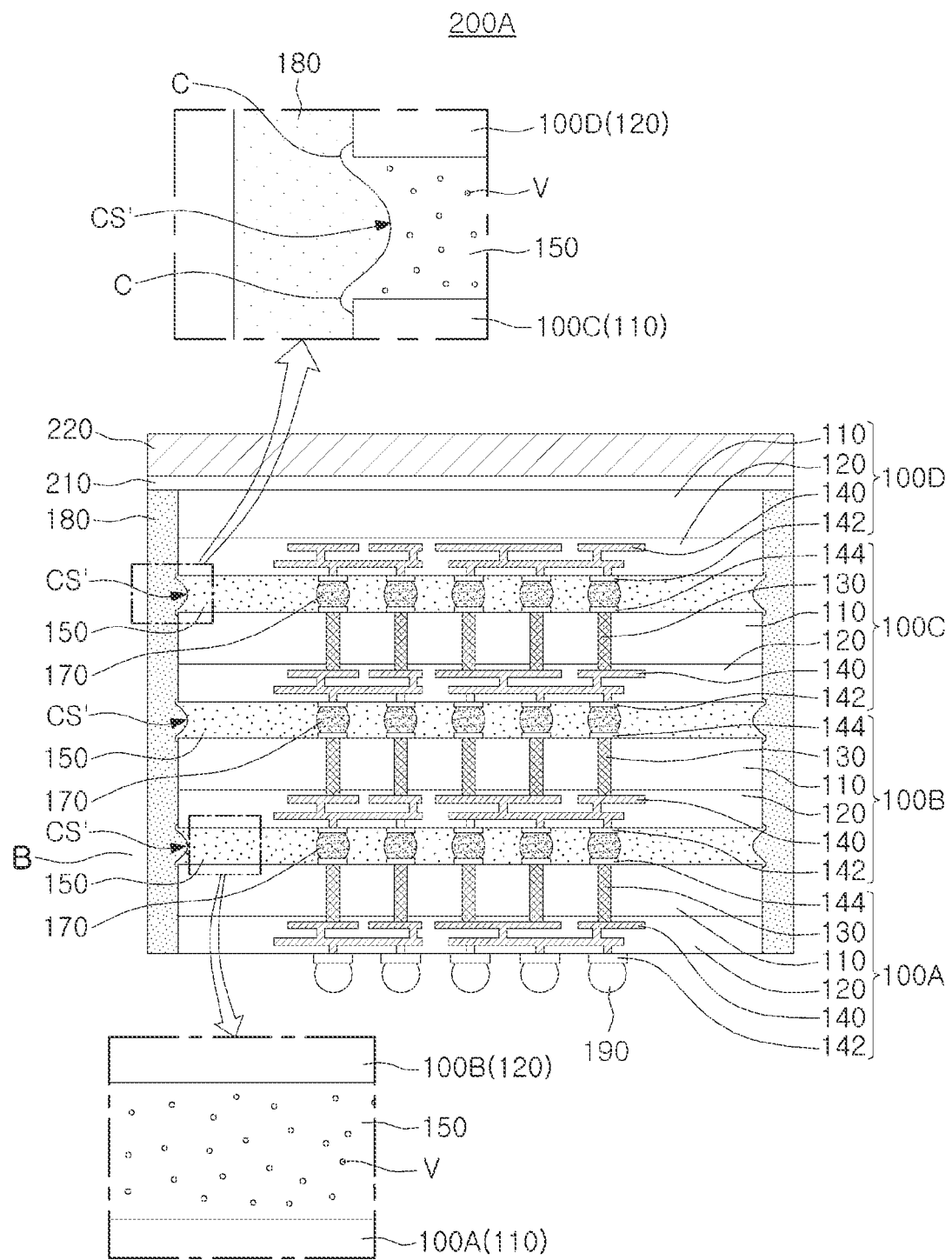
FIGS. 4 and 5 are cross-sectional views illustrating a semiconductor package according to various embodiments of the present disclosure.
Figure 5:
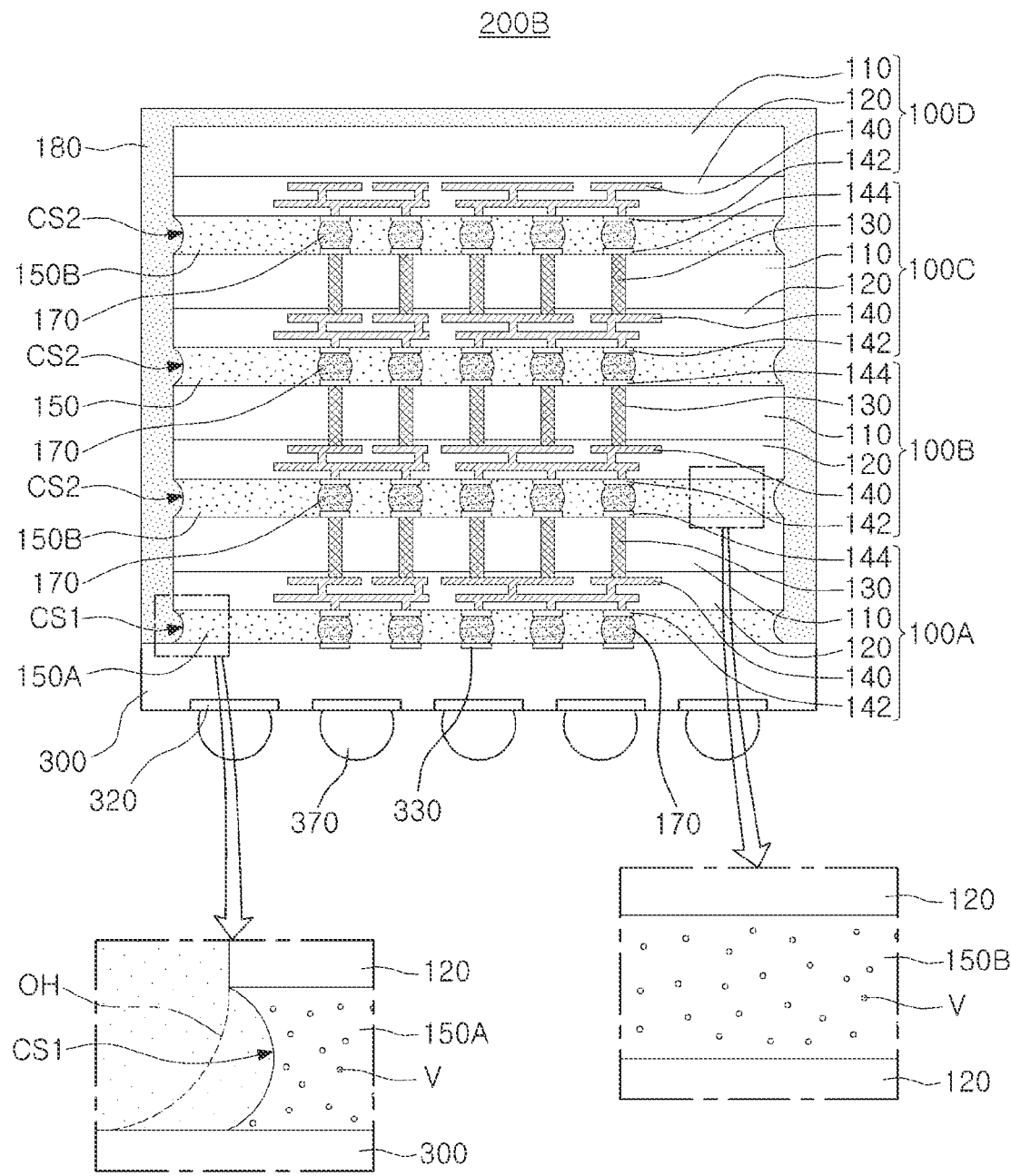

Aspects of the present disclosure may be advantageously applied to semiconductor packages having various structures. In some example embodiments, the distribution and shape of voids and the shape of the side surface of the non-conductive films 150 may differ depending on the process conditions of pressure bonding, such as viscosity and/or hydrostatic bonding of the uncured non-conductive films. FIGS. 4 and 5 are cross-sectional views illustrating semiconductor packages according to various example embodiments of the present disclosure.

FIG. 4 may be understood as illustrating a similar structure as the example embodiment described with reference to FIG. 1, except that the semiconductor package 200A of FIG. 4 includes a heat sink 220 at an upper portion thereof and has a different shape of a side surface of the non-conductive film 150. Accordingly, the description of the example embodiment shown in FIG. 1 may be combined with the description of the present example embodiment unless otherwise stated.

Referring to FIG. 4, the semiconductor package 200A according to the present example embodiment may include the first to fourth semiconductor chips 100A, 100B, 100C, and 100D stacked in a vertical direction, and may further include a thermal conductive material layer 210 and a heat sink 220 sequentially arranged on the uppermost semiconductor chip (e.g., the fourth semiconductor chip 100D).

The thermal conductive material layer 210 may be between the heat sink 220 and the fourth semiconductor chip 100D and may cover the upper surface of the fourth semiconductor chip 100D. The thermal conductive material layer 210 may help heat generated from the first to fourth semiconductor chips 100A, 100B, 100C, and 100D to be smoothly discharged to the heat sink 220. The thermal conductive material layer 210 may include a thermal interface material (TIM). For example, the thermal conductive material layer 210 may be made of an insulating material, or may be made of a material capable of maintaining electrical insulating properties including an insulating material. The thermal conductive material layer 210 may include, for example, an epoxy resin. Specific examples of the thermal conductive material layer 310 may be mineral oil, grease, gap filler putty, phase change gel, phase change material pad pads, or particle filled epoxy.

The heat sink 220 may be arranged on the thermal conductive material layer 210. The heat sink 220 may be, for example, a heat sink, a heat spreader, a heat pipe, or a liquid cooled cold plate.

The thermal conductive material layer 210 may cover, and in some example embodiments may completely cover, the upper surface of the fourth semiconductor chip 100D. Increased coverage of the upper surface of the fourth semiconductor chip 100D by the thermal conductive material layer 210 may result in a corresponding increase in a contact area between the fourth semiconductor chip 100D and the thermal conductive material layer 210. As a result, heat generated from the first to fourth semiconductor chips 100A, 100B, 100C, and 100D may be more efficiently transferred to the heat sink 220.

As discussed with reference to FIG. 1, the non-conductive films 150 of the semiconductor package 200A may include voids V. The voids V are voids that are intentionally distributed in the uncured non-conductive films in order to induce shrinkage of the non-conductive films 150 in the manufacturing process of the semiconductor package, and remain after bonding. For example, voids V in non-conductive films 150 may be filled with an unreacted gas, such as nitrogen.

The voids V of the non-conductive films 150 may have an average diameter of 1 μm to 100 μm. The volume fraction of the voids V may be in a range of 0.1 to 5 vol %. In some example embodiments, the voids V of the non-conductive films 150 have an average diameter of 50 μm or less, and the volume fraction of the voids V may be in a range of 0.1 to 2 vol %.

Referring to FIG. 4, side surfaces CS' of the non-conductive films 150 may have concave shapes recessed inward of the side surfaces of adjacent semiconductor chips 100C and 100D, similar to the example embodiment of FIG. 1. However, some regions C of the non-conductive films 150 may cover a portion of the side surfaces of the adjacent semiconductor chips 100C and 100D. This shape may be understood as a form in which a portion of the non-conductive films 150 may be recessed inward during the hydrostatic bonding process after covering a portion of the side surfaces of the adjacent semiconductor chips 100C and 100D in a pressing process for pre-bonding after lamination.

As such, the non-conductive films 150 according to some example embodiments are not limited to those in which an entire area of the non-conductive films 150 is located further inside the side surfaces of the first to fourth semiconductor chips 100A, 100B, 100C, and 100D, and in some example embodiments the non-conductive films 150 may have a shape in which a portion thereof protrudes from and/or remains on a side surface of one or both adjacent semiconductor chips, and the side surfaces of the non-conductive films 150 may have a side surface that is substantially flat with the side surface of the adjacent semiconductor chip, rather than a concave shape, or may have a convex shape.

Referring to FIG. 5, a semiconductor package 200B according to some example embodiments may be understood as a semiconductor package similar to the semiconductor package 200 illustrated in FIG. 1, except that the semiconductor package 200B further includes a base substrate 300, and side-surface shapes of some non-conductive films 150A, 150B may different from each other. Accordingly, descriptions of the example embodiment illustrated in FIG. 1 may be combined with the description of the present example embodiment unless otherwise stated.

The semiconductor package 200B according to the present example embodiment may include a base substrate 300 and first and to fourth semiconductor chips 100A, 100B, 100C, and 100D, which are mounted on the base substrate 300 and sequentially stacked in a direction, perpendicular to the upper surface of the base substrate 300.

The base substrate 300 may be, for example, a printed circuit board, a ceramic substrate, or an interposer. When the base substrate 300 is a printed circuit board, the base substrate 300 may include a lower surface pad 320 and an upper surface pad 330, a wiring layer connecting the lower surface pad 320 and the upper surface pad 330 (not shown), and an external connection terminal 370 arranged on the lower surface pad 320. In some example embodiments, the base substrate 300 may be an interposer, and in this case, the base substrate 300 may include a substrate body made of a semiconductor material. For example, the substrate body may be formed from a silicon wafer. The external connection terminal 340 may electrically connect the semiconductor package 200B with an external device. The external connection terminal 370 may be, for example, solder balls or bumps.

In some examples embodiment, and as shown in FIG. 5, the first to fourth semiconductor chips 100A, 100B, 100C, and 100D have the same area, while the base substrate 300 may have an area, larger than each area of the first to fourth semiconductor chips 100A, 100B, 100C. However, the present disclosure is not limited thereto.

A molding member 180 that surrounds some or all of the first to fourth semiconductor chips 100A, 100B, 100C, and 100D may be formed on the base substrate 300. The molding member 180 may include, for example, an epoxy mold compound. As illustrated in FIG. 5, the molding member 180 may be arranged on the base substrate 300 and may have a coplanar surface substantially flat with a side surface of the base substrate 300. The coplanar side surfaces may be understood as side surfaces obtained by the same cutting process.

Second non-conductive films 150B may be between adjacent pairs of the first to fourth semiconductor chips 100A, 100B, 100C, and 100D, and may have concave side surfaces CS2 recessed inward of the side surfaces of the adjacent semiconductor chips 100A, 100B, 100C, and 100D The second non-conductive films 150B may be similar to the non-conductive films 150 of the example embodiments described with reference to FIGS. 1 and 4.

A first non-conductive film 150A may be interposed between the base substrate 300 and the first semiconductor chip 100A. In some example embodiments, the first non-conductive film 150A may use the same or similar material as the second non-conductive films 150B. In some example embodiments, the first non-conductive film 150A may use a different material, such as an underfill material layer, than the second non-conductive films 150B. The first nonconductive film 150A may surround the side surfaces of the connection conductors 170 electrically and mechanically coupling the first semiconductor chip 100A with the base substrate 300.

The first non-conductive film 150A may be likely to overflow due to surface tension of the base substrate 300 having a relatively large area as compared with the first semiconductor chip 100A, and as such may differ from the second non-conductive films 150B arranged between adjacent pairs of the first to fourth semiconductor chips 100A, 100B, 100C, and 100D having the same area. The first non-conductive film 150A may flow out on the upper surface of the base substrate 300 to have an overhang portion OH (shown by an imaginary line as an extended portion of the first non-conductive film 150A), and as a result, an area may be reduced where the molding member 180 is to be formed on the upper surface of the base substrate 300, which may cause a bonding failure with the molding member 180. On the other hand, in some example embodiments including the semiconductor package 200B illustrated in FIG. 5, the first non-conductive film 150A may have side surfaces recessed inwardly between the base substrate 300 and the first semiconductor chip 100B when the hydrostatic bonding is applied, similar to the second non-conductive film 150B. The recessed side surface CS1 may have a concave curved surface, and an occurrence of the overhang portion OH may be suppressed.

The concave side surfaces CS1 and CS2 of the first and second non-conductive films 150A and 150B may be adjusted by not only hydrostatic bonding process conditions (e.g., temperature, pressure, curing rate, or the like), but also by viscosity of the first and second nonconductive films 150A and 150B, and the like.

The first and second non-conductive films 150A and 150B employed in the present example embodiment may include voids V, similar to the previous example embodiments. The concave side surfaces CS1 and CS2 may be shapes obtained by hydrostatic bonding (see FIG. 10). Since the pressure applied during hydrostatic bonding is applied not only in a lamination direction but also in a width direction of the first and second non-conductive films 150A and 150B, the thickness of the uncured non-conductive film may be sufficiently reduced, while suppressing the side surfaces of the first and second non-conductive films 150A and 150B being flowed out to the outside, such that the connection conductor 170 can be stably connected to the upper connection pad 144 and an upper surface pad 330. As such, in the present example embodiment, by intentionally providing voids to the uncured non-conductive film, it is possible to ensure a connection having improved reliability in the semiconductor package 200B, and in the first and second non-conductive films 150A and 150B, as described above, the voids V may be distributed in a reduced size and volume fraction than in the uncured non-conductive film.

When the second non-conductive films 150B are formed by the same bonding process, the voids V of the second non-conductive films 150B may have the same or similar distributions. For example, the volume fraction of the voids V of the second non-conductive films 150B may have a deviation of less than 5%. Similarly thereto, the voids V of the second non-conductive films 150B may have similar sizes. For example, the average size of the voids V of the second non-conductive films 150B may have a deviation less than 5%. However, the first and second non-conductive films 150A and 150B having different connection objects may have slightly different pore distributions.

FIGS. 6 to 11 are cross-sectional views illustrating main processes for describing a manufacturing method of a semiconductor package according to some example embodiments of the present disclosure. The manufacturing method according to the present disclosure may be understood as a method of manufacturing the semiconductor package 200 illustrated in FIG. 1.

Figure 6:
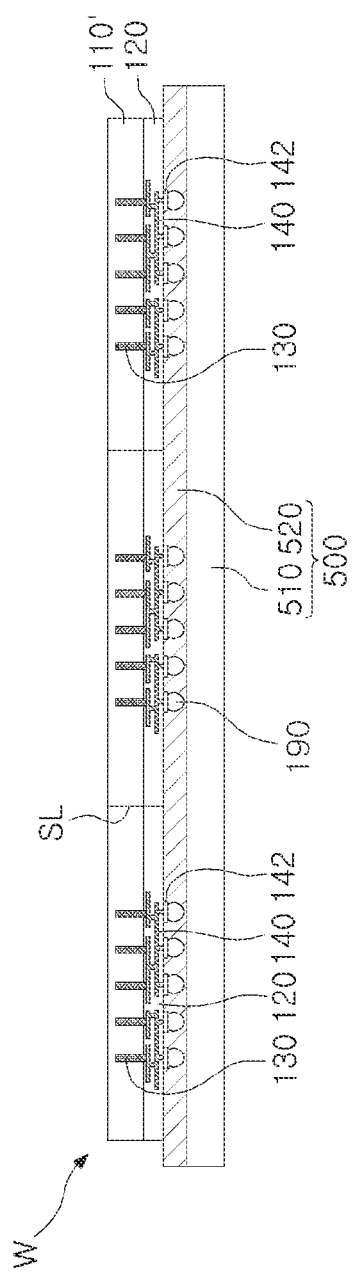
FIGS. 6 to 11 are cross-sectional views illustrating main processes for describing a method of manufacturing a semiconductor package according to some example embodiments of the present disclosure.

Referring to FIG. 6, a semiconductor wafer W on which a plurality of first semiconductor chips 100 are implemented is attached to a carrier substrate 500.

The semiconductor wafer W may include a plurality of first semiconductor chips 100 divided by scribe lanes SL.

Each of the plurality of first semiconductor chips 100 may include a semiconductor substrate 110, a semiconductor device layer 120, and a through-electrode 130, respectively. The semiconductor device layer 120 may be on a lower surface of the semiconductor substrate 110, and the through-electrode 130 may penetrate at least a portion of the semiconductor substrate 110 and connected to a wiring structure of the semiconductor device layer 120.

The semiconductor device layer 120 may be on a lower surface of the semiconductor substrate 110, and the through-electrode 130 may penetrate at least a portion of the semiconductor substrate 110 and connected to a wiring structure of the semiconductor device layer 120. An external connection conductor 190 may be formed by forming a mask pattern (not shown) having an opening for exposing a portion of the lower connection pad 142 on the semiconductor device layer 120, and then providing a conductive material on a region of the lower connection pad 142 exposed through the opening of the mask pattern. For example, the external connection conductor 190 may be a pillar structure and a solder ball formed by an electroplating process.

The carrier substrate 500 may include a support substrate 510 and an adhesive material layer 520. The semiconductor wafer W may be attached to the adhesive material layer 520 of the carrier substrate 500 such that the connection conductor 170 faces the carrier substrate 500. The external connection conductor 190 may be surrounded by the adhesive material layer 520. A portion of the lower surface of the semiconductor substrate 110 where the connection conductor 170 is not formed may also contact the adhesive material layer 520.

Figure 7:
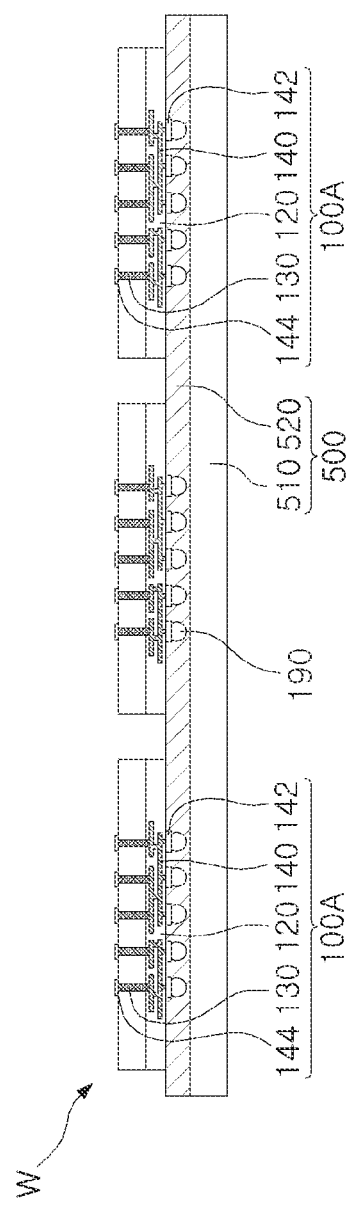

Referring to FIG. 7, a portion of the semiconductor wafer W is removed to expose the through-electrode 130, and an upper connection pad 144 electrically connected to the through-electrode 130 may be formed on an upper surface of a first semiconductor chip 100A. Subsequently, the plurality of first semiconductor chips 100 may be formed by cutting the semiconductor wafer W along the scribe lanes SL.

An exposure of the through-electrode 130 may be performed by a chemical mechanical polishing (CMP) process, an etch-back process, or a combination thereof with respect to the semiconductor wafer (W). As a result, at least a portion of the through-electrode 130 may protrude from the exposed surface of the semiconductor wafer W, that is, the upper surface of the semiconductor substrate 110. The thickness of the semiconductor substrate 110 may be reduced by the present process.

Subsequently, an upper passivation layer (not shown) covering an exposed surface of the semiconductor wafer W, that is, an upper surface 114 of the semiconductor substrate 110, and then an upper connection pad 144 electrically connected to the through-electrode 130 on the upper passivation layer may be formed. The upper passivation layer may be formed such that an upper end of the through-electrode 130 is exposed. The upper passivation layer may include, for example, an insulating polymer or an oxides or nitrides.

Figure 8:
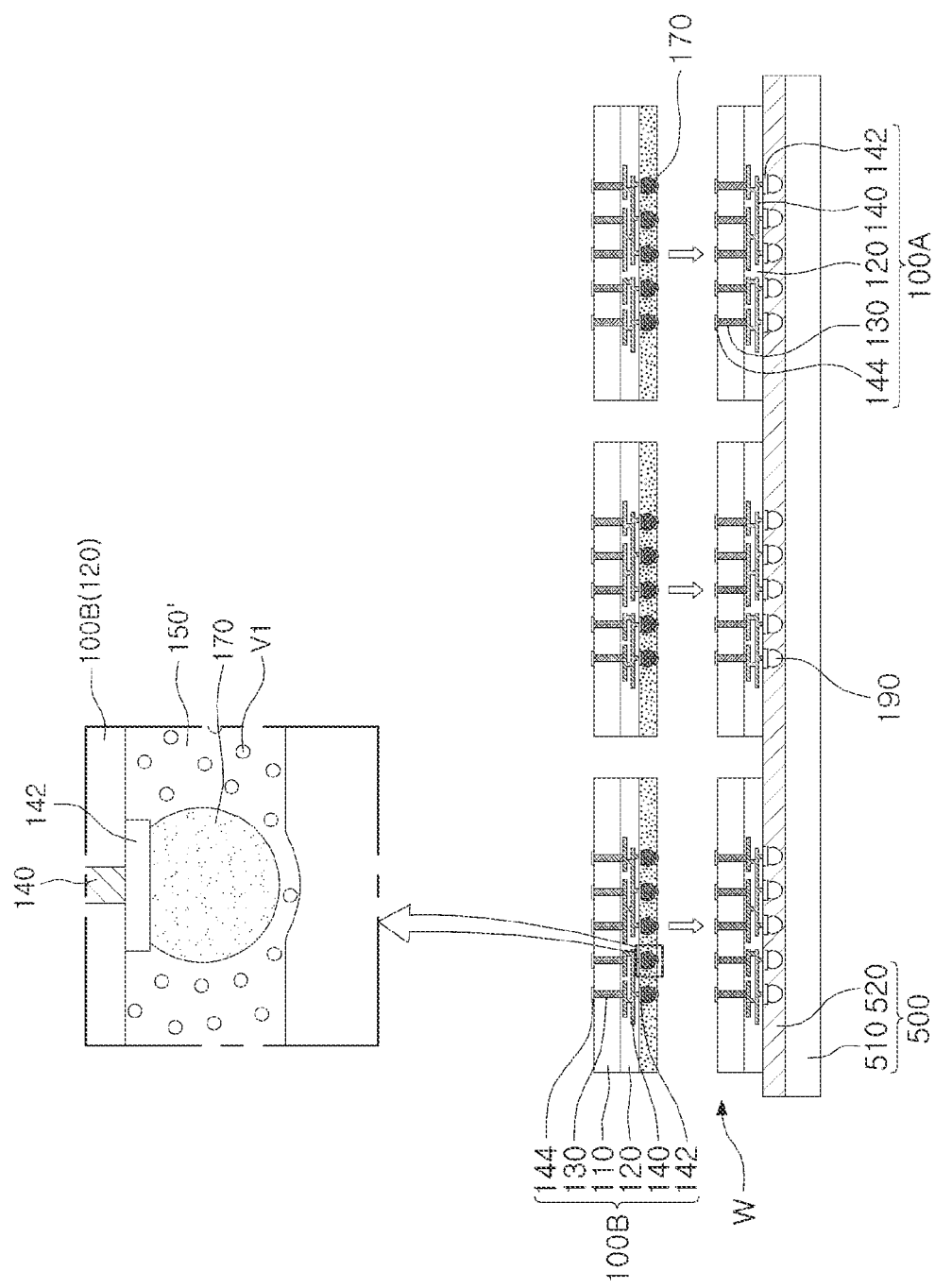

Referring to FIG. 8, second semiconductor chips 100B having an uncured non-conductive film 150' attached thereto may be stacked on the first semiconductor chips 100A, respectively.

The second semiconductor chips 200 may be manufactured using a further semiconductor wafer (not shown), similar to the process illustrated in FIGS. 6 and 7. The uncured non-conductive film 150' may be attached to the lower surface of the semiconductor wafer on which the lower connection pads 142 and the connection conductors 170 are formed, and the second semiconductor chip 100B illustrated in FIG. 8 may be manufactured by cutting the semiconductor wafer along the scribe lane.

The uncured non-conductive film 150' employed in the some example embodiments intentionally may include first voids V1 to sufficiently generate volume shrinkage during the pressure bonding process. The first voids V1 in the uncured non-conductive film 150 may have an average diameter so that sufficient volume shrinkage occurs and may be distributed at a volume fraction. For example, the average diameter of the first voids V1 may be in a range of 150 μm to 300 μm. In addition, the volume fraction of the first voids V1 may be in a range of 8 to 20 vol %.

Although the distribution of the first voids V1 is not desirable for reliability in a final package structure, the first voids V1 are removed or reduced so that the thickness of the non-conductive film 150' is reduced through a pressing process such as hydrostatic bonding, a final void (V2 in FIG. 10) may have a smaller size and volume fraction than in the uncured non-conductive film 150.

Figure 9:
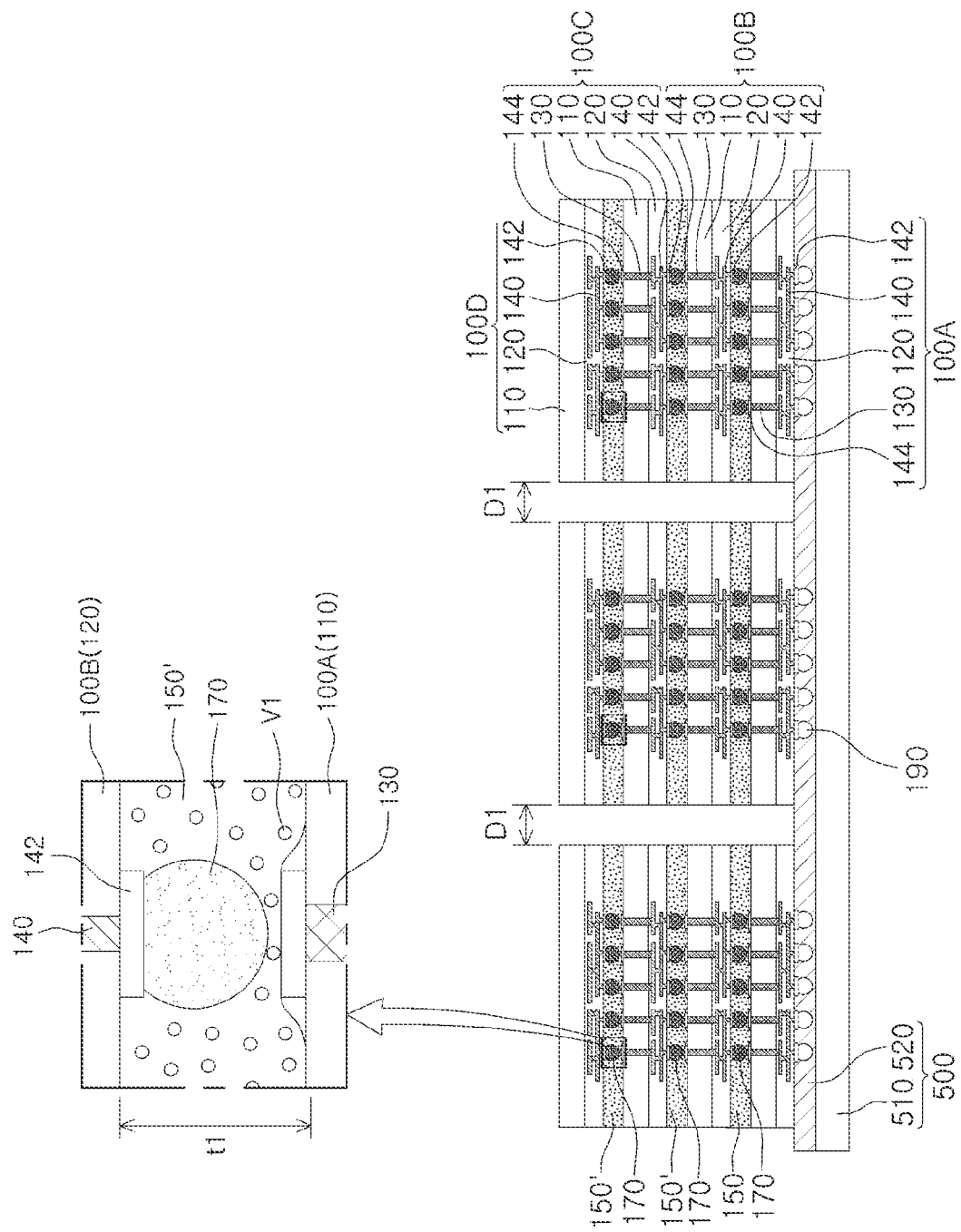

Referring to FIG. 9, third semiconductor chips 100C and fourth semiconductor chips 100D to which the uncured non-conductive film 150' are applied may be sequentially stacked on the second semiconductor chips 100B.

In the present stacking process, manufacturing and/or stacking of the third semiconductor chips 100C and the fourth semiconductor chips 100D may be performed the same or similarly according to the manufacturing and stacking processes of the second semiconductor chips 100B described with reference to FIG. 8. However, the fourth semiconductor chips 100D positioned at an uppermost portion thereof may not include a through-electrode and an upper connection pad. The first to fourth semiconductor chips 100A, 100B, 100C, and 100D may be the same semiconductor chip (e.g., a memory chip), but in some example embodiments at least one of the first to fourth semiconductor chips 100A, 100B, 100C, and 100D may be a different semiconductor chip (a further memory chip or logic chip).

After the stacked first to fourth semiconductor chips 100A, 100B, 100C, and 100D are arranged in advance on a carrier substrate (not shown) at a predetermined interval D1 from each other by a semiconductor chip transfer device (not shown), the first to fourth semiconductor chips 100A, 100B, 100C, and 100D may be transferred to be positioned on the upper connection pad 144 of the first to third semiconductor chips 100A, 100B, and 100C in which the connection conductor 170 of the second to fourth semiconductor chips 100B, 100C, and 100D is positioned therebelow. In the present example embodiment, the distance D1 may be defined by the cutting process of FIG. 7.

In another example embodiment, the first to fourth semiconductor chips 100A, 100B, 100C, and 100D may also be transferred to a wafer level. For example, in the semiconductor package process illustrated in FIG. 1, it may be individualized through a process of transferring the first to fourth semiconductor chips 100A, 100B, 100C, and 100D to the carrier substrate at the wafer level and then cut to a desired interval.

Here, in the following process, the distance D1 may be a distance large enough for the molding member 180 of FIG. 11 to surround the side surfaces of the first to fourth semiconductor chips 100A, 100B, 100C, and 100D and the side surfaces of the first and second non-conductive films 140 and 150.

In some example embodiments, the stacked first to fourth semiconductor chips 100A, 100B, 100C, and 100D may be maintained in a pre-bonded state using the adhesiveness of the non-conductive films 150 without additional processes, in some example embodiments, pre-bonding may be performed through a separate process. In detail, the stack of the first to fourth semiconductor chips 100A, 100B, 100C, and 100D may be preliminarily bonded using a thermocompression. In the pre-bonding process, a contact between the connection conductor 170 and the upper connection pad 144 may be formed, but the present disclosure is not limited thereto.

Figure 10:
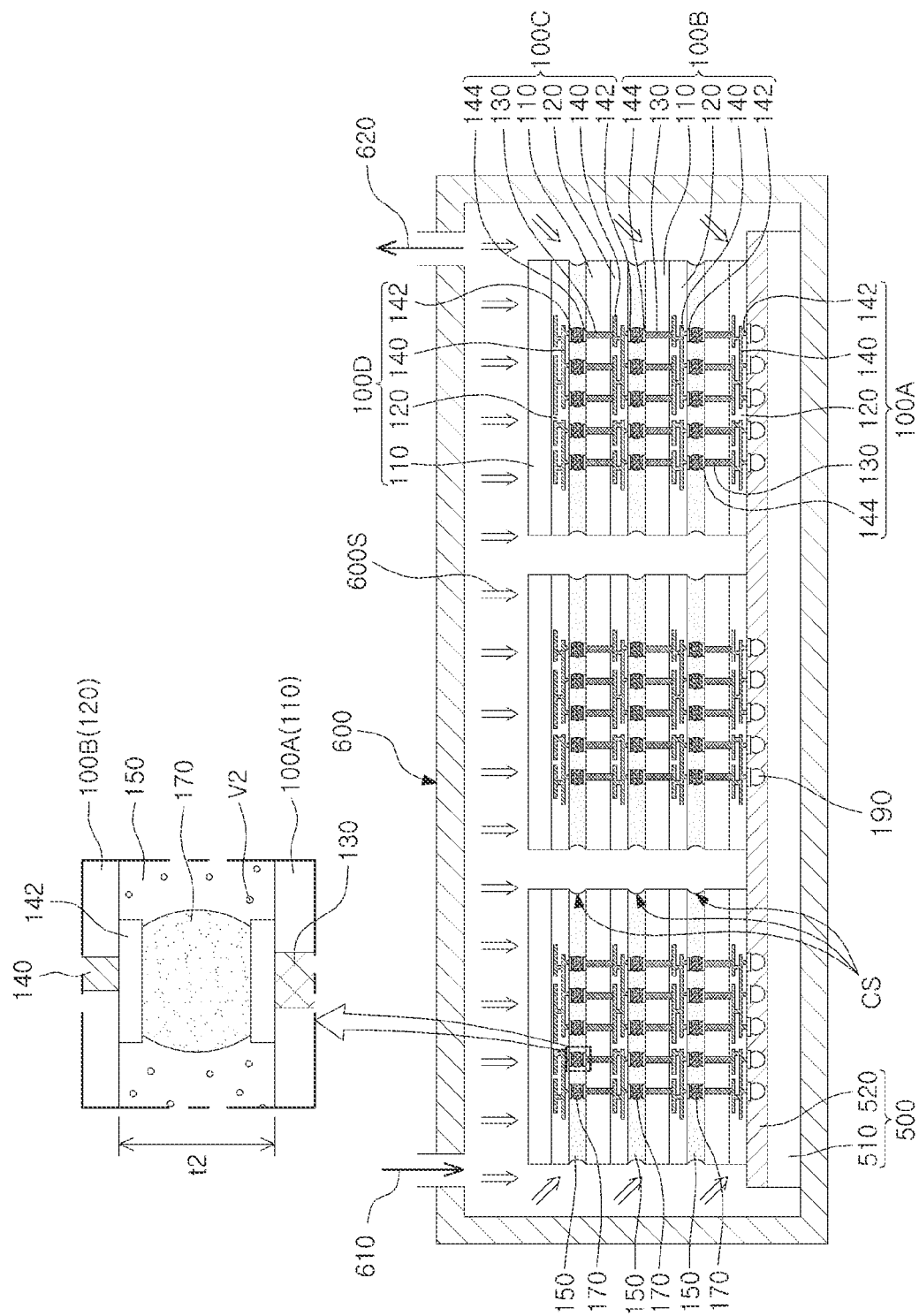

Referring to FIG. 10, the stacks of the semiconductor chips obtained in FIG. 9 may be arranged in a hydrostatic chamber 600 to cure the non-conductive film 150 using a pressurized fluid.

The hydrostatic pressure chamber 600 used in the present process may have a sealed internal space 600S provided with an inlet 610 and an outlet 620 of a pressurized fluid. The stacks of semiconductor chips may be arranged in the internal space of the hydrostatic chamber 500, the uncured non-conductive films (150' of FIG. 9) may be heated to a melting/curing temperature, and then hydrostatic pressure may be applied to the stacks of the semiconductor chip by injecting the pressurized fluid.

In the hydrostatic bonding process, a predetermined heat and pressure may be applied to the non-conductive film 150 interposed between the first to fourth semiconductor chips 100A, 100B, 100C, and 100D and the connection conductor 170, the non-conductive film 150 may be melted, the connection conductor 170 may be connected to and weighted with the upper connection pad 144, respectively, and the connection conductor 170 may form an intermetallic compound to lower contact resistance with the upper connection pad 144 located thereunder. The non-conductive film 150 may be cured to provide bonding having high reliability.

In this process, even when the pressure by the pressurized fluid is applied to the side surface of the non-conductive film 150, a first void (V1 of FIG. 10) may be released or reduced in a temperature range in which the non-conductive film 150' is melted. Thus, the thickness t2 of the non-conductive film 150 may be significantly reduced than the thickness (t1 of FIG. 9) of the uncured non-conductive film (150' in FIG. 9). Through such a thickness reduction, a more stable connection between the connection conductor 170 and the upper connection pad 144 may be created.

In some example embodiments, in the cured non-conductive film 150, second voids V2 (e.g., an average diameter of 1 μm or more, a volume fraction of 0.1 vol % or more) may remain, and the second void V2 may have an average diameter and a volume fraction, smaller than the first void V1 by the volume reduction process described above. For example, the average diameter of the second voids V2 may be reduced to 100 μm or less. In addition, the volume fraction of the second void V2 may also be reduced to 5 vol % or less. In some example embodiments, the average diameter of the second void V2 may be 50 μm or less. In addition, the volume fraction of the second void V2 may be in a range of 2 vol %.

Meanwhile, the non-conductive film 150 may have a concave side surface CS recessed inward of the side surfaces of the adjacent semiconductor chips due to the pressure applied to the side surface of the non-conductive film 150 in the hydrostatic bonding process. In some example embodiments, the hydrostatic bonding process may be performed at a temperature of 200° C. or higher and at a pressure of 10 atmospheres or higher (e.g., 20 atmospheres).

Figure 11:
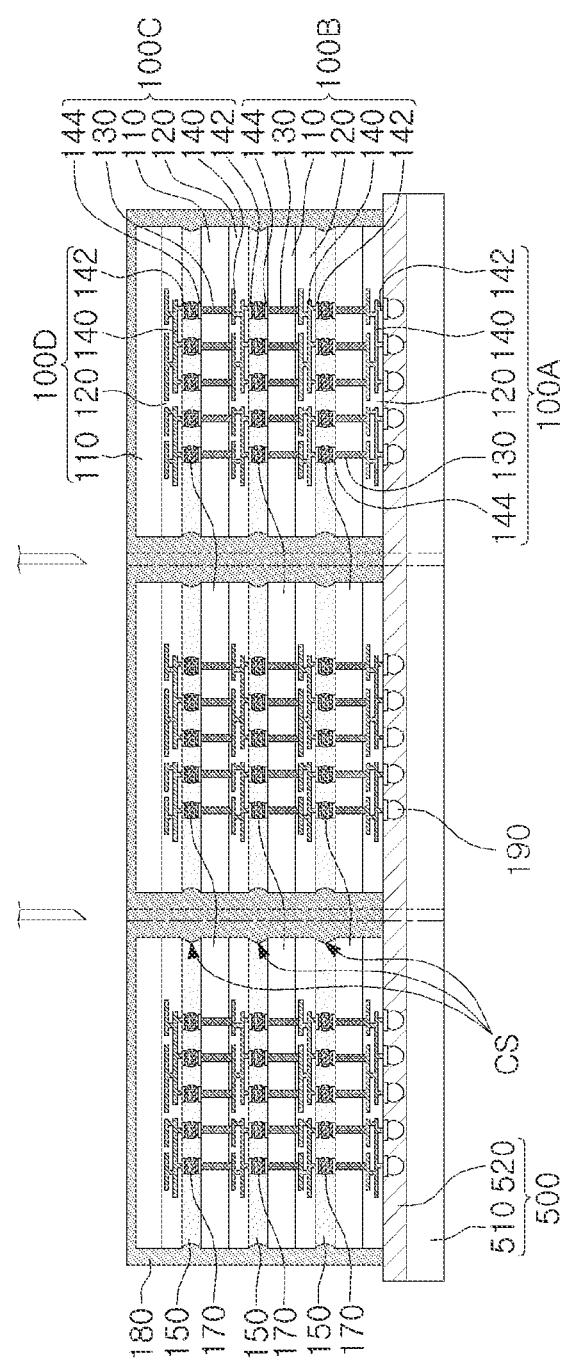

Referring to FIG. 11, a molding member 180 covering the first to fourth semiconductor chips 100A, 100B, 100C, and 100D stacked on the carrier substrate 500 may be formed.

The molding member 180 may cover side surfaces of the first to fourth semiconductor chips 100A, 100B, 100C, and 100D, and may be formed to cover the upper surface of the fourth semiconductor chip 100D in the present example embodiment. In addition, the molding member 180 may be formed to surround the concave side surfaces of the non-conductive film 150. Subsequently, a cutting process (a dotted portion may be removed) may be individualized into the semiconductor package 200 shown in FIG. 1. Since the side surface of the molding member has a concave curved surface CS of the non-conductive film 150, a bonding area of the molding member 180 and the non-conductive film 150 may be increased to increase the bonding strength, and as described above, the reliability of the semiconductor package can be improved by ensuring the stable connection between the connection conductor and the upper connection pad using voids in the non-conductive film.

Referring to FIGS. 6 to 11, a manufacturing method of the semiconductor package 200 has been described, however, it will be apparent to those skilled in the art that within the scope of the present inventive concepts, the semiconductor packages 200A and 200B according to other example embodiments may be manufactured in addition to the semiconductor package 200 by applying various modifications and changes from the description. For example, the semiconductor package 200B shown in FIG. 4 may be prepared via a method that is similar to the processes described in FIGS. 6 to 11, but uses the wafer-shaped base substrate 300 instead of a separate carrier substrate 500.

Figure 12:
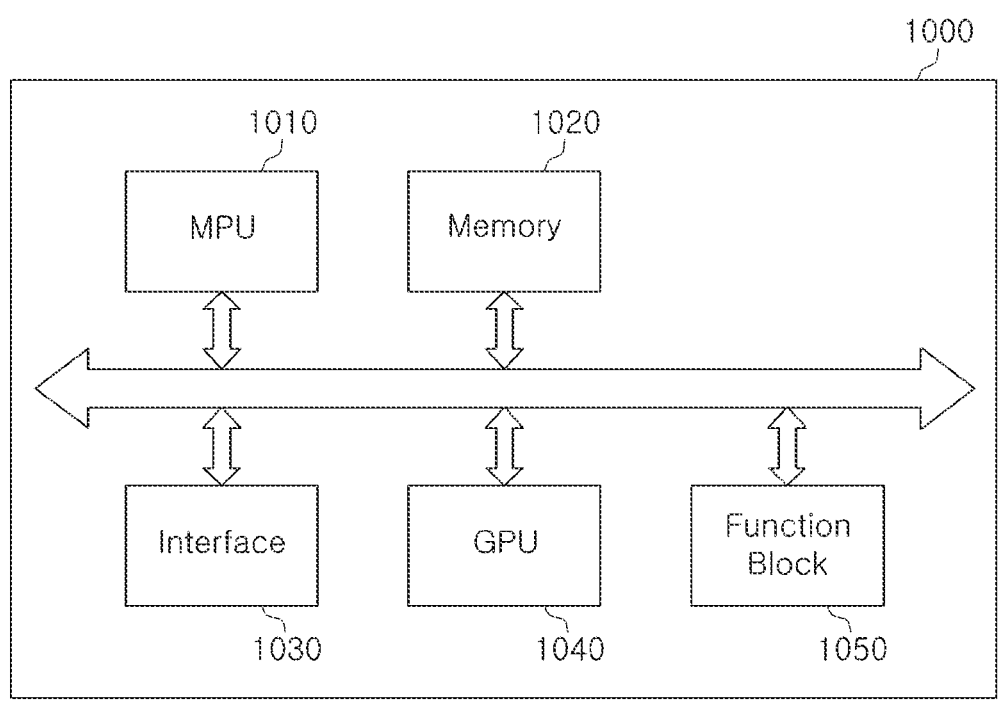
FIG. 12 is a block diagram illustrating a configuration of a semiconductor package according to some example embodiments of the present disclosure.

FIG. 12 is a block diagram illustrating a configuration of a semiconductor package according to some example embodiments.

Referring to FIG. 12, a semiconductor package 1000 may include a micro processing unit 1010, a memory 1020, an interface 1030, a graphic processing unit 1040, functional blocks 1050, and a bus connecting thereto. The semiconductor package 1000 may include both the micro processing unit 1010 and the graphic processing unit 1040, or may include only one of the two.

The micro processing unit 1010 may include a core and an L2 cache. For example, the micro processing unit 1010 may include a multi-core. Each core of the multi-core may have the same or different performance. In addition, each core of a multi-core may be activated at the same time or may be activated at different times from each other.

The memory 1020 may store a result of processing in the functional blocks 1050 by a control of the micro processing unit 1010. The interface 1030 may exchange information or signals with external devices. The graphic processing unit 1040 may perform graphic functions. For example, the graphic processing unit 1040 may perform a video codec or process 3D graphics. The functional blocks 1050 may perform various functions. For example, when the semiconductor package 1000 is an AP used in a mobile device, a portion of the functional blocks 1050 may perform a communication function. Here, the semiconductor package 1000 may include the semiconductor packages 200, 200A, and 200B described with reference to FIGS. 1, 4, and 5.

As set forth above, by intentionally distributing voids in non-conductive films (NCF), volume shrinkage (particularly, thickness reduction) of the non-conductive films may be induced through removal and/or reduction of the voids in a press bonding process such as hydrostatic bonding, thereby ensuring stable connection of a connection conductor (e.g., solder) and a pad (e.g., upper connection pad).

In particular, in the bonding process, the non-conductive film may effectively prevent a phenomenon in which a non-conductive film is followed-out in a lateral direction, thereby improving reliability of the semiconductor package.

The various and advantageous advantages and effects of the present inventive concepts are not limited to the above description, which is provided to enable a more easy understanding of the present inventive concepts through describing specific example embodiments of the present inventive concepts.

Therefore, while examples of embodiments of the present inventive concepts have been illustrated and described above, those skilled in the art will understand that modifications and variations could be made without departing from the scope of the present inventive concepts as defined by the appended claims.

What is claimed is:

1. A method of manufacturing a semiconductor package, comprising:
preparing a first semiconductor chip having a through-electrode and an upper connection pad connected to the through-electrode on an upper surface of the first semiconductor chip;
preparing a second semiconductor chip having a lower connection pad on a lower surface thereof and a connection conductor on the lower connection pad;
applying an uncured non-conductive film to the lower surface of the second semiconductor chip to cover the connection conductor, wherein the uncured non-conductive film includes voids that have a first average diameter at a first volume fraction;
stacking the second semiconductor chip to which the uncured non-conductive film is applied on the first semiconductor chip; and
heating and pressurizing the stacked first and second semiconductor chips using a pressurized fluid to cure the non-conductive film, the cured non-conductive film including voids that have a second average diameter at a second volume fraction, the second average diameter smaller than the first average diameter and the second volume fraction less than the first volume fraction.

2. The method of claim 1, wherein during the heating and pressurizing of the stacked first and second semiconductor chips, the connection conductor is connected to the upper connection pad of the first semiconductor chip through the uncured non-conductive film.

3. The method of claim 1, further comprising pre-bonding the stacked first and second semiconductor chips using thermocompression, wherein the pre-bonding occurs between the stacking and the heating and pressurizing.

4. The method of claim 1, wherein the uncured conductive film has a first thickness, and wherein the cured conductive film has a second thickness that is smaller than the first thickness.

5. The method of claim 1, wherein the first average diameter is in a range of 150 μm to 300 μm, and the second average diameter is 100 μm or less.

6. The method of claim 1, wherein the second average diameter is in a range of 1 μm to 100 μm.

7. The method of claim 1, wherein the first volume fraction is in a range of 8 to 20 vol %, and the second volume fraction is 5 vol % or less.

8. The method of claim 1, wherein the second volume fraction is in a range of 0.1 to 5 vol %.

9. The method of claim 1, wherein a side surface of the non-conductive film cured by the pressurized fluid has a concave side surface created during the curing of the non-conductive film.

10. The method of claim 1, wherein the heating and pressurizing is performed in a temperature of 200° C. or higher and 10 atm or higher.

11. A method of manufacturing a semiconductor package, comprising:
- preparing a first semiconductor chip having a through-electrode and an upper connection pad connected to the through-electrode on an upper surface of the first semiconductor chip;
- stacking a second semiconductor chip having a lower connection pad on a lower surface thereof and a connection conductor on the lower connection pad on the first semiconductor chip, with an uncured non-conductive film between the first and the second semiconductor chips; and
- heating and pressurizing the stacked first and second semiconductor chips using a pressurized fluid to cure the non-conductive film,
- wherein the uncured non-conductive film includes voids having a first average diameter in a range of 150 μm to 300 μm, and wherein the cured non-conductive film includes voids having a second average diameter in a range of 1 μm to 100 μm, and
- wherein a side surface of the cured non-conductive film has a concave shape when viewing the semiconductor package in cross-section.

12. The method of claim 11, wherein the second average diameter is 50 μm or less.

13. The method of claim 11, wherein the uncured non-conductive film includes voids at a first volume fraction, and the cured non-conductive film includes voids at a second volume fraction that is smaller than the first volume fraction, and wherein the second volume fraction is in a range of 0.1 to 5 vol %.

14. The method of claim 13, wherein the second volume fraction is 2 vol % or less.

15. The method of claim 11, wherein a nitrogen-containing gas is in the voids of the cured non-conductive film.

16. The method of claim 11, further comprising providing a molding member on at least side surfaces of the stacked first and second semiconductor chips and on the side surface of the cured non-conductive film.

17. The method of claim 16, further comprising providing a heat sink on the molding member and on an upper surface of the second semiconductor chip.

18. A method of manufacturing a semiconductor package, comprising:
- preparing a first semiconductor chip having a through-electrode and an upper connection pad connected to the through-electrode on an upper surface of the first semiconductor chip;
- stacking a second semiconductor chip having a lower connection pad on a lower surface thereof and a connection conductor on the lower connection pad on the first semiconductor chip, with an uncured non-conductive film between the first and the second semiconductor chips; and
- heating and pressurizing the stacked first and second semiconductor chips using a pressurized fluid to cure the non-conductive film,
- wherein the uncured non-conductive film includes voids having a first average diameter, and the cured non-conductive film includes voids having a second average diameter that is smaller than the first average diameter.

19. The method of claim 18, wherein the second average diameter is in a range of 1 μm to 100 μm.

20. The method of claim 19, wherein the first average diameter is in a range of 150 μm to 300 μm, and wherein the voids of the cured non-conductive film include a gas comprising nitrogen.

* * * * *